United States Patent [19]
Ihara et al.

[11] Patent Number: 5,432,742
[45] Date of Patent: Jul. 11, 1995

[54] SYSTEM MEMORY AND A MICROCOMPUTER COMPRISING THE SAME

[76] Inventors: Makoto Ihara, 491-1-202, Tani, Sakurai-shi, Nara-ken; Toshio Mimoto, 1-4-8, Nishichiyogaoka, Nara-shi, Nara-ken; Yukihiro Yoshida, 4-398-254, Higashiikoma, Ikoma-shi, Nara-ken, all of Japan

[21] Appl. No.: 55,840

[22] Filed: Apr. 29, 1993

[30] Foreign Application Priority Data

Apr. 30, 1992 [JP] Japan ............................ 4-111733
Dec. 4, 1992 [JP] Japan ............................ 4-325808

[51] Int. Cl.⁶ .................... G11C 7/00; G11C 17/00
[52] U.S. Cl. .................... 365/189.01; 365/104
[58] Field of Search ............ 365/104, 94, 95, 96, 365/103, 189.11, 189.01

[56] References Cited

U.S. PATENT DOCUMENTS 4,575,819  3/1986  Amin ........................... 365/104
4,855,803  8/1989  Azumai et al. ............... 365/103
4,995,004  2/1991  Lee ............................ 365/189.11

FOREIGN PATENT DOCUMENTS 55-57196  4/1980  Japan .

OTHER PUBLICATIONS

Shubat et al., "Mappable memory subsystem for high speed applications" 1989 *Symposium on VLSI Circuits Digest of Technical Papers*, May 25-27, 1989, pp. 47-48.
U.S. patent application Ser. No. 08/003,991 (Jan. 15, 1993).

*Primary Examiner*—Joseph A. Popek
*Attorney, Agent, or Firm*—Morrison & Foerster

[57] ABSTRACT

A system memory which includes a plurality of memory cells capable of functioning as ROMS or RAMs and being arranged in an arbitrary minimum unit. The read only area includes the memory cells functioning as the ROMS, and the write and read area includes the memory cells functioning as the RAMs. The read only areas and the write and read areas can be mixed and arranged in a memory space of the system memory without discontinuity nor a overlap. In a microcomputer including the system memory, a program is stored in the read only area, and data is stored in the write and read area.

13 Claims, 20 Drawing Sheets

SYSTEM MEMORY AND A MICROCOMPUTER COMPRISING THE SAME

BACKGROUND OF THE INVENTION

1. Field of the Invention

The present invention relates to a system memory to be used in a digital processor such as a computer, and it also relates to a microcomputer comprising the same.

2. Description of the Related Art

FIG. 7 exemplarily shows a conventional system memory provided with a read only memory (ROM) and a random access memory (RAM). This system memory comprises four memory devices 14a, 14b, 14c, and 14d, a central processing unit (CPU) 11, and a memory controller 12.

Between the CPU 11 and the memory controller 12, address signals 210, data signals 220, and control signals 230 are transmitted in the directions of the arrows as shown in FIG. 7. Moreover, between the memory controller 12 and the memory devices 14a to 14d, address signals 211, data signals 221, chip enable (CE) signals 232 to 235, a write enable (WE) signal 236, and an output enable (OE) signal 237 are transmitted in the directions shown by the arrows in FIG. 7.

FIG. 9 schematically shows the memory space of the conventional system memory comprising the memory devices 14a to 14d. A memory space having a capacity of 1 megabyte (MB) is divided into four areas a to d each having a capacity of 256 kilobytes (kB). The four memory devices 14a to 14d are allocated to the four areas a to d, respectively. More specifically, the memory devices 14a and 14c functioning as ROMs are allocated to the areas a and c, and the memory devices 14b and 14d functioning as RAMs are allocated to the areas b and d. However, each of the areas a to d can arbitrarily be allocated for the ROMs or RAMs. Herein, the conventional memory devices 14a to 14d are each made of a single memory chip.

FIG. 8 shows a conventional architecture of the memory controller 12. The CE signals 232 to 235 are generated from a memory read signal /MR and a memory write signal /MW of the control signals 230, and address signals A18 and A19. The address signals A18 and A19 corresponding to the most and second most significant of the address signals (A0 to A19) generated from the address signals 210. The address signals each have a capacity of 1 bit and designate a location in the memory space. One of the four CE signals 232 to 235 is activated so as to select one memory device corresponding to the activated CE signals among the four memory devices 14a to 14d.

In the memory controller 12, the WE signal 236 and the OE signal 237 are generated from the memory write signal /MW and the memory read signal /MR, respectively. The address signals 211 are generated from address latch enable signals ALE and the address signals 210. The data signals 221 are transmitted from the CPU 11 to the memory devices 14a to 14d, and vice versa, via the memory controller 12 in accordance with a signal /R indicating a transmitting direction of the data.

However, according to the above conventional system memory, the maximum size of the area allocated for the memory device (ROM or RAM) is limited depending upon the capacity of the memory device (memory chip). Therefore, in the case where the memory space is allocated for ROMs and RAMs, a decrease in the number of memory devices to be used results in the limitation of the allocation. That is, the degree of freedom for the allocation is remarkably narrowed, thereby making it difficult to design the system memory.

On the other hand, in the case where a number of memory devices (ROMs and RAMs) are used for the memory space, each capacity of the memory devices (for example, 256 kB) cannot be utilized sufficiently and effectively. Furthermore, the address decode circuit becomes much more complicated due to the necessity of selecting a desired memory device among a number of memory devices.

That is, for the production of a system memory with a memory space having a capacity of 1 MB, composed of ROMs and RAMs each having a capacity of 256 bytes, 4096 memory devices are required. However, when so many memory devices are used in the system memory, wirings connected around the memory devices become complicated, and thus the system memory becomes complicated and inefficient. Furthermore, there is no existing memory device having such a small capacity (256 B) in actuality.

Therefore, conventionally, there has only been a system memory with a memory space comprising a relatively small number of ROMs and RAMs each having a capacity of several kB or more as shown in FIG. 9.

As is apparent from the above, according to the prior art, it is impossible to realize a system memory with a memory space in which a number of write and read areas and read only areas are mixedly included, and an address can freely be allocated as desired. That is, neither memory space having a capacity of 1 MB composed of ROMs and RAMs each having a small capacity (256 B), nor memory space in which such ROMs and RAMs are included in a freely mixed manner can be realized conventionally.

SUMMARY OF THE INVENTION

In the system memory of this invention, a memory space comprises a plurality of read only areas and a plurality of write and read areas, and the read only areas and the write and read areas are mixedly arranged in the memory space without discontinuity nor an overlap in an arbitrary minimum unit.

The microcomputer of this invention comprises ROMs and RAMs, in which ROM areas and RAM areas are successively arranged in the same memory space, and a memory capacity of the ROM areas and a memory capacity of RAM areas can arbitrarily be set on the basis of a predetermined total memory capacity of the ROM areas and the RAM areas in an arbitrary minimum unit.

Another microcomputer of this invention comprises ROMs and RAMs, in which ROM areas are successively arranged in a memory space, and RAM areas are successively arranged in another memory space, and a memory capacity of the ROM areas and a memory capacity of the RAM areas can arbitrarily be set on the basis of a predetermined total memory capacity of the ROMs and the RAMs in an arbitrary minimum unit.

Thus, the invention described herein makes possible the advantages of (1) providing a system memory in which the capacity of each of the memory devices is utilized sufficiently and effectively, and (2) providing a microcomputer comprising such a system memory.

These and other advantages of the present invention will become apparent to those skilled in the art upon reading and understanding the following detailed description with reference to the accompanying figures.

BRIEF DESCRIPTION OF THE DRAWINGS

FIG. 2 schematically shows a memory cell array for memory devices and peripheral circuits thereof in the system memory of FIG. 1a.

FIG. 21 schematically shows a memory space of the microcomputer of FIG. 18a.

DESCRIPTION OF THE PREFERRED EMBODIMENTS

Hereinafter, the present invention will be described in detail by way of illustrating examples.

Example 1

Figure 2:
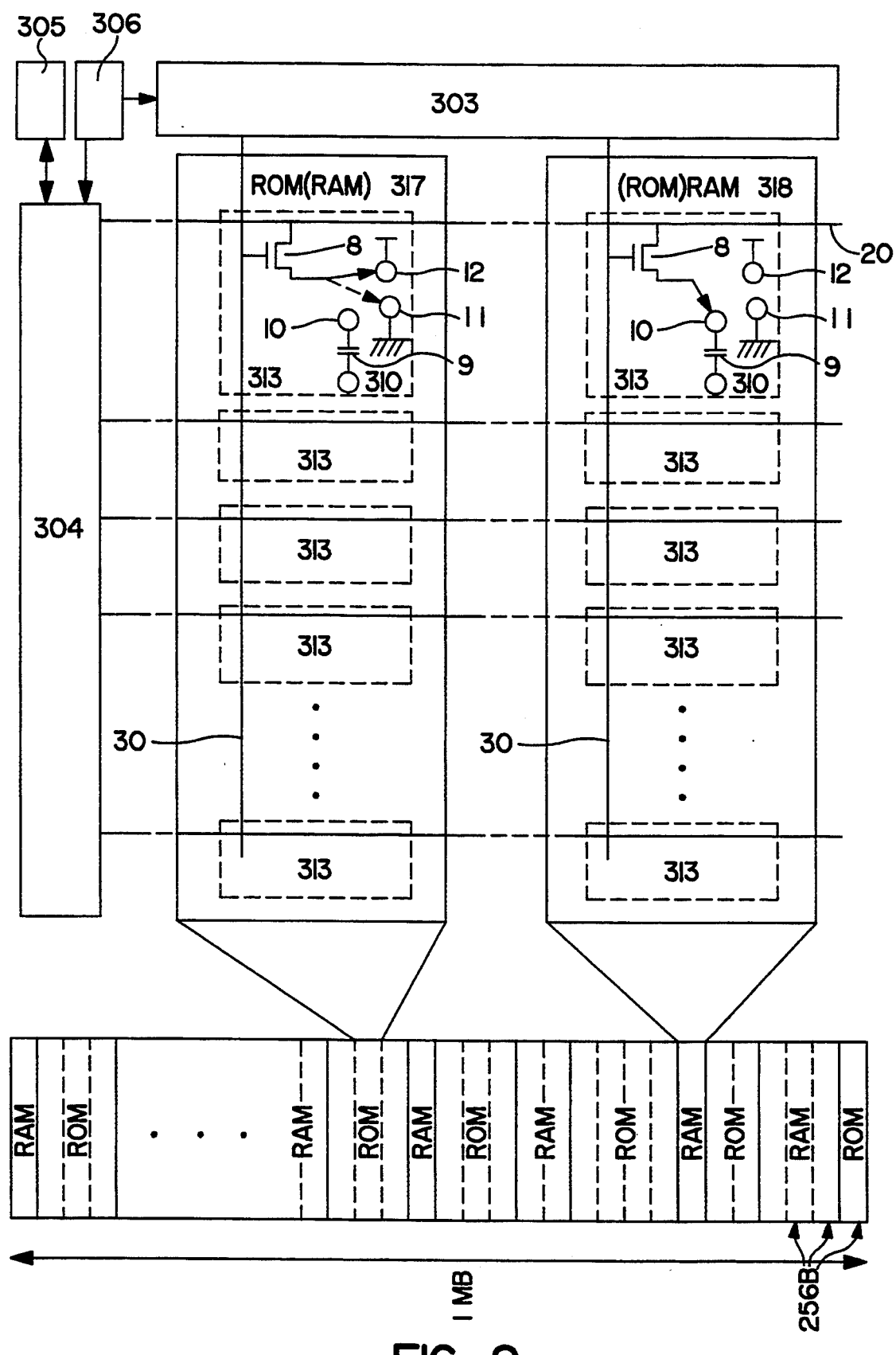

FIG. 2 schematically shows a memory cell array of a memory device and peripheral circuits thereof in a system memory according to a first example of the present invention.

The memory cell array comprises a plurality of memory cells 313 arranged in a matrix, and has a memory capacity of 1 MB. Each of the memory cells 313 has a device capable of selectively functioning as a ROM element or RAM element.

In the memory cell 313, in the case where a terminal 10 of a capacitor 9 is connected to a MOS transistor 8, a signal charge on a bit line 20 is stored in the capacitor 9, or a signal charge stored in the capacitor 9 is read out, through the MOS transistor 8 connected to a selected word line 30. In this case, the memory cell 313 functions as a RAM. On the other hand, in the case where the bit line 20 is connected to a grounded potential line 11 or another line 12 through the MOS transistor 8 connected to the selected word line 30, the memory cell 313 functions as a ROM.

Figure 10:
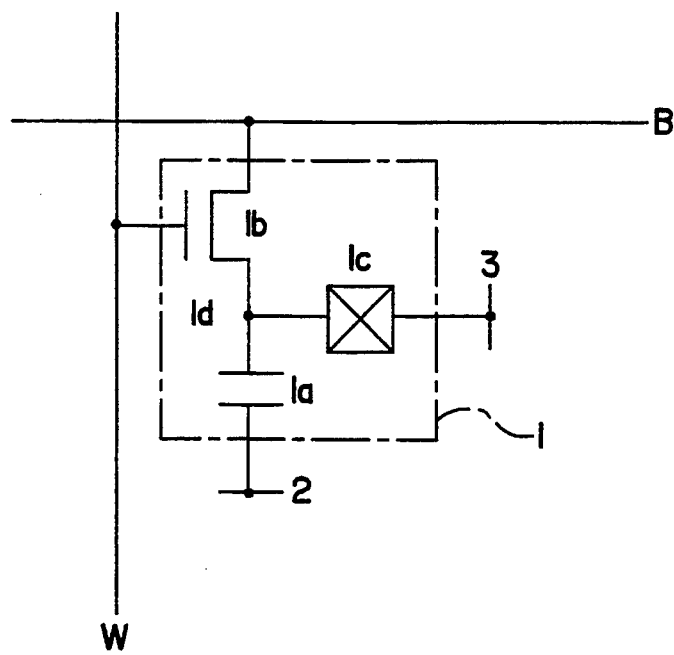
FIG. 10 shows an exemplary structure of a memory cell shown in FIG. 2.

FIG. 10 shows an exemplary structure of a memory cell capable of functioning as a ROM or a RAM. In a memory cell 1, one of terminals of a capacitor 1a is connected to a bit line B via a channel region provided between the source and the drain of a MOS transistor 1b. The gate of the MOS transistor 1b is connected to a word line W. Therefore, activation of the word line W allows an electrical conduction between the source and the drain of the MOS transistor 1b, and thus the capacitor 1a is connected to the bit line B. The other of the terminals of the capacitor 1a is connected to a first reference potential 2 with a voltage of $\frac{1}{2}$ Vcc. A node 1d between the MOS transistor 1b and the capacitor 1a is connected to a second reference potential 3 via a stationary switch circuit 1c. In a production process for a semiconductor, it is previously determined whether the electrical connection between the node 1d and the second reference potential 3 via the stationary switch circuit 1c is allowed or not.

Part of the memory cell array can be used as a ROM area so as to store information, and the other part of the memory cell array can be used as a RAM area so as to write and read data or the like. That is, as to the memory cell 1 in the ROM area, in the production process of the semiconductor, it is previously determined whether the electrical connection between the node 1d and the second reference potential 3 via the stationary switch circuit 1c is allowed or not, in accordance with the stationary information stored in the ROM area. On the other hand, as to the memory cell 1 in the RAM area, the node 1d is set so as not to be electrically connected to the second reference potential 3. The first reference potential 2 ($\frac{1}{2}$ Vcc) shown in FIG. 10 corresponds to a stationary electrode 310 in FIG. 2.

The structure of the memory cell capable of functioning as a ROM or a RAM is not limited to the above structure shown in FIG. 10, but another structure may be employed, such as a structure described in Japanese Patent Application NO. 3-269894.

Hereinafter, a structure for the memory cell array will be described. Generally, in a semiconductor memory device, a word line is designated as "a row line", and a bit line is designated as "a column line". According to such designation, a memory cell group connected to the same word line is conveniently designated as "a memory cell row" herein. As shown in FIG. 2, every memory cell 313 in a memory cell row 317 functions as a ROM cell. On the other hand, every memory cell 313 in a memory cell row 318 functions as a RAM cell. Alternatively, the ROM cells and RAM cells can be mixed in the same memory cell row 317 or 318.

Figures 1A, 1B:
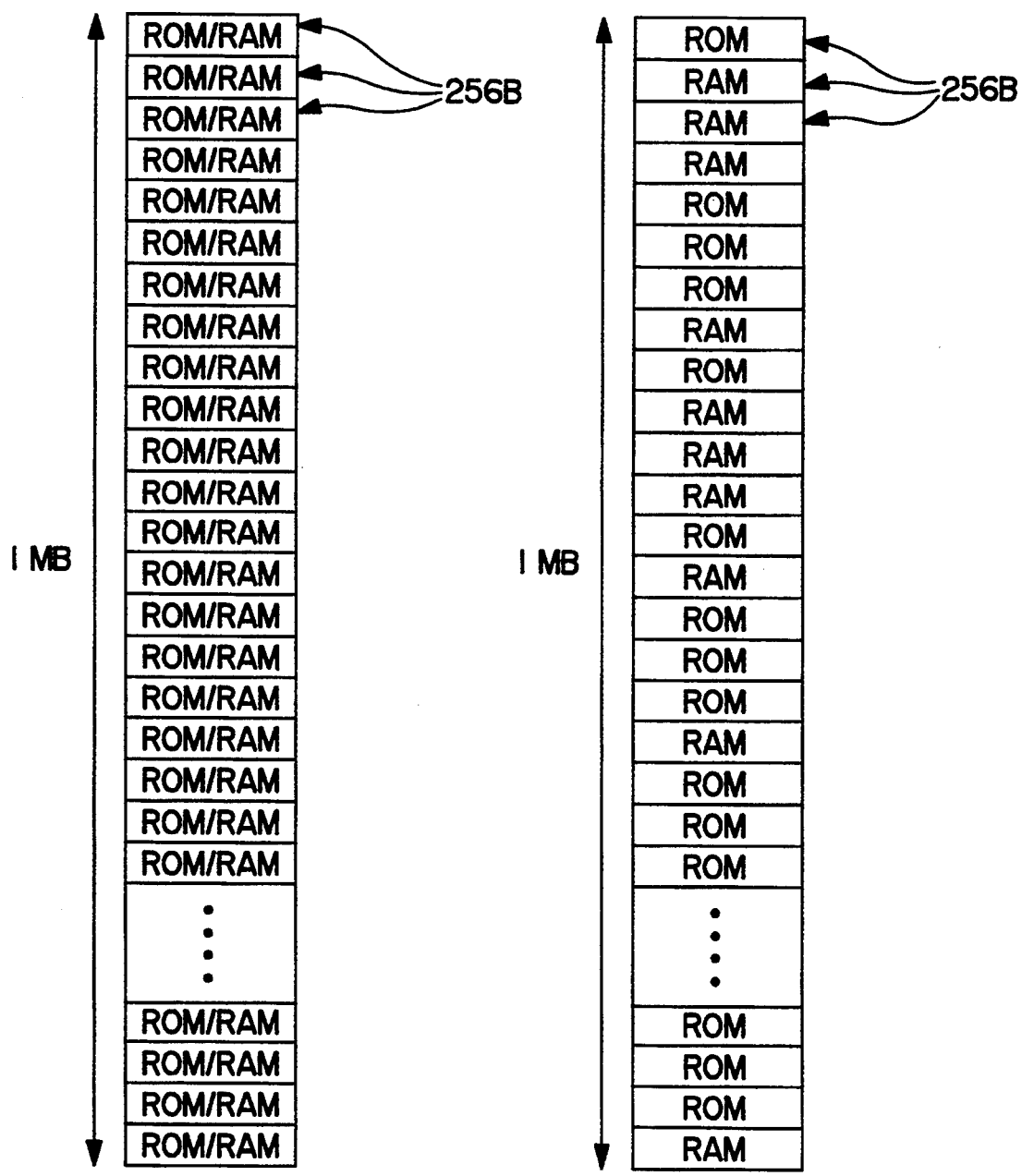
FIG. 1a shows a configuration for a memory space of a system memory according to a first example of the present invention.
FIG. 1b shows a configuration for a memory space of a system memory according to a second example of the present invention.

This memory cell array comprises 4096 ($2^{12}$) memory cell rows. Each of the memory cell rows comprises 2048 ($2^{11}$) memory cells 313. The 2048 memory cells 313 correspond to a memory capacity of 256 B. Thus, each of the memory cell rows has a memory capacity of 256 B. As a result, the memory cell array has a memory capacity of 1 MB ($2^{11} \times 2^{12} = 2^{23}$) in total. In other words, in the system memory according to the present example, as shown in FIG. 1a, areas each having a capacity of 256 B (minimum unit) and functioning as a ROM area or RAM area are arranged without discontinuity in a memory space of 1 MB.

As shown in FIG. 2, there are peripheral circuits of the memory cell array including a row address decode circuit 303, a circuit 304 including a column address decode circuit and a data read circuit, an I/O buffer 305, and an address buffer 306.

As is described above, the system memory of the present example comprises a memory device made of a single chip in which elements (memory cells) capable of functioning as ROMs or RAMs are arranged. Thus, in the memory space having a capacity of 1 MB, the ROMs and RAMs can be freely arranged by arbitrarily changing the arrangement of the memory cell rows 317 and 318, etc. Moreover, the ROMs and RAMs can be mixed in the same memory cell row 317 or 318, thereby allowing the ROMs and RAMs to have an arbitrary capacity. For example, the ROMs and RAMs each having a capacity of 1 B (minimum unit) can be arranged.

According to a conventional system memory, ROMs and RAMs cannot be freely arranged. On the other hand, according to the present invention, it is possible to freely arrange ROMs and RAMs since the ROM areas and RAM areas each having a capacity of 256 B (minimum unit) can be mixed in the memory space.

As the memory device of the present example, not only the memory device made of a single chip, but a memory device group made of a plurality of chips can be employed.

On the other hand, Japanese Laid-Open Utility Model Publication No. 55-57196 discloses a memory circuit comprising a circuit capable of arbitrarily setting a boundary address between a nonvolatile memory address area and a volatile memory address area. However, in this case, a boundary address between a single ROM area and a single RAM area can only be set arbitrarily. Therefore, according to such a memory circuit, a number of ROM areas and RAM areas cannot be mixed.

Example 2

Figure 3:
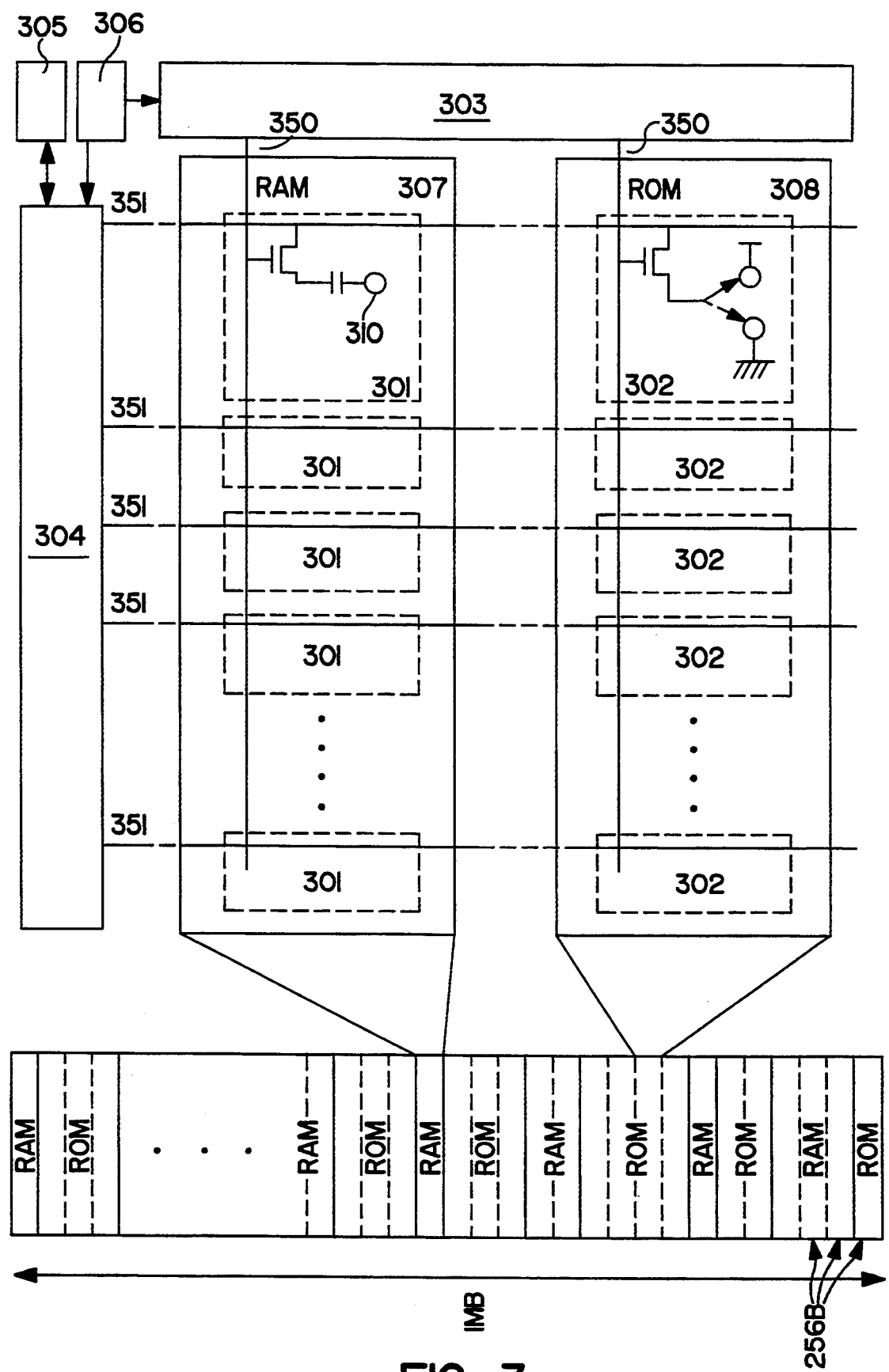
FIG. 3 schematically shows a memory cell array for memory devices and peripheral circuits thereof in the system memory of FIG. 1b.

FIG. 3 schematically shows a memory cell array of a memory device and peripheral circuits thereof in a system memory according to a second example of the present invention.

A memory cell array having a memory capacity of 1 MB comprises memory cells 301 or 302 arranged in a matrix. Each of the memory cells 301 or 302 comprises a ROM element or RAM element. Hereinafter, a memory cell having a ROM element is designated as a ROM cell 302, and a memory cell having a RAM element is designated as a RAM cell 301.

In the second example, every memory cell 301 in a memory cell row 307 is a RAM cell. On the other hand, every memory cell 302 in a memory cell row 308 is a ROM cell. Alternatively, the ROM cells and RAM cells can be mixed in the same memory cell row 307 or 308.

This memory cell array comprises 4096 ($2^{12}$) memory cell rows. Each of the memory cell rows comprises 2048 ($2^{11}$) memory cells 301 or 302. In the system memory according to the present example, as shown in FIG. 1b, areas each having a capacity of 256 B (minimum unit) and functioning as a ROM area or RAM area are arranged without discontinuity in a memory space of 1 MB.

As shown in FIG. 3, there are peripheral circuits of the memory cell array such as a row address decode circuit 303, a circuit 304 including a column address decode circuit and a data read circuit, an I/O buffer 305, and an address buffer 306.

As is described above, the system memory of the present example comprises a memory device made of a single chip in which elements (memory cells) capable of functioning as ROMs or RAMs are arranged. Thus, in the memory space having a capacity of 1 MB, the ROMs and RAMs can be freely arranged by arbitrarily changing the arrangement of the memory cell rows 307 and 308, etc. Moreover, the ROMs and RAMs can be mixed in the same memory cell row 307 or 308, thereby allowing the ROMs and RAMs to have an arbitrary capacity. For example, the ROMs and RAMs having a capacity of 1 B (minimum unit) can be arranged.

In the present example, not only the memory device made of a single chip, but a memory device group made of a plurality of chips can be employed.

Example 3

Figure 4:
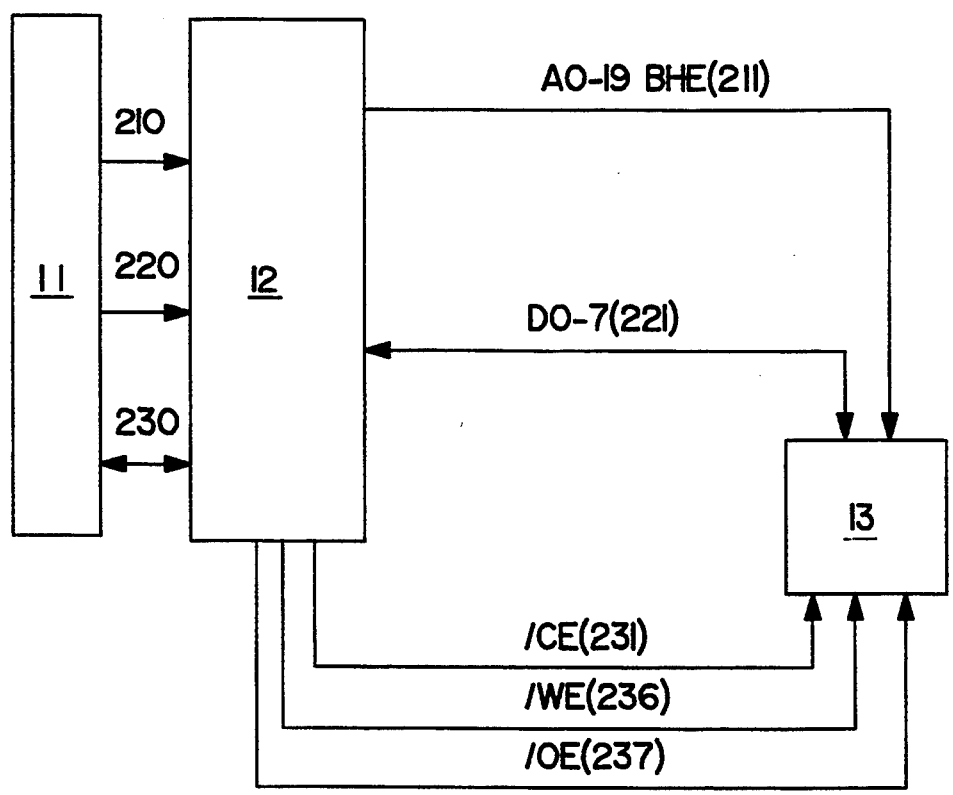
FIG. 4 schematically shows the structure of a DOS system for a personal computer comprising the system memory of the present invention.

FIG. 4 schematically shows a structure for a DOS system for a personal computer according to a third example of the present invention. The system memory comprises a 8086 type CPU 11, a memory controller 12, and a memory device 13. In this memory device 13, ROMs and RAMs can freely be arranged in the same manner as described in Examples 1 and 2.

Between the CPU 11 and the memory controller 12, address signals 210, data signals 220, and control signals 230 are transmitted in the directions of the arrows shown in FIG. 4. Between the memory controller 12 and the memory device 13, address signals (A0 to A19, BHE) 211, data signals (D0 to D7) 221, /CE signals 231, a /WE signal 236, and an /OE signal 237 are transmitted in the directions of the arrows as shown in FIG. 4.

The memory controller 12 generates the /CE signals 231, /WE signal 236, /OE signal 237, and address signals 211 from the control signals 230. The data signals 221 are transmitted from the CPU 11 to the memory device 13 and vice versa, through the memory controller 12.

Figure 5:
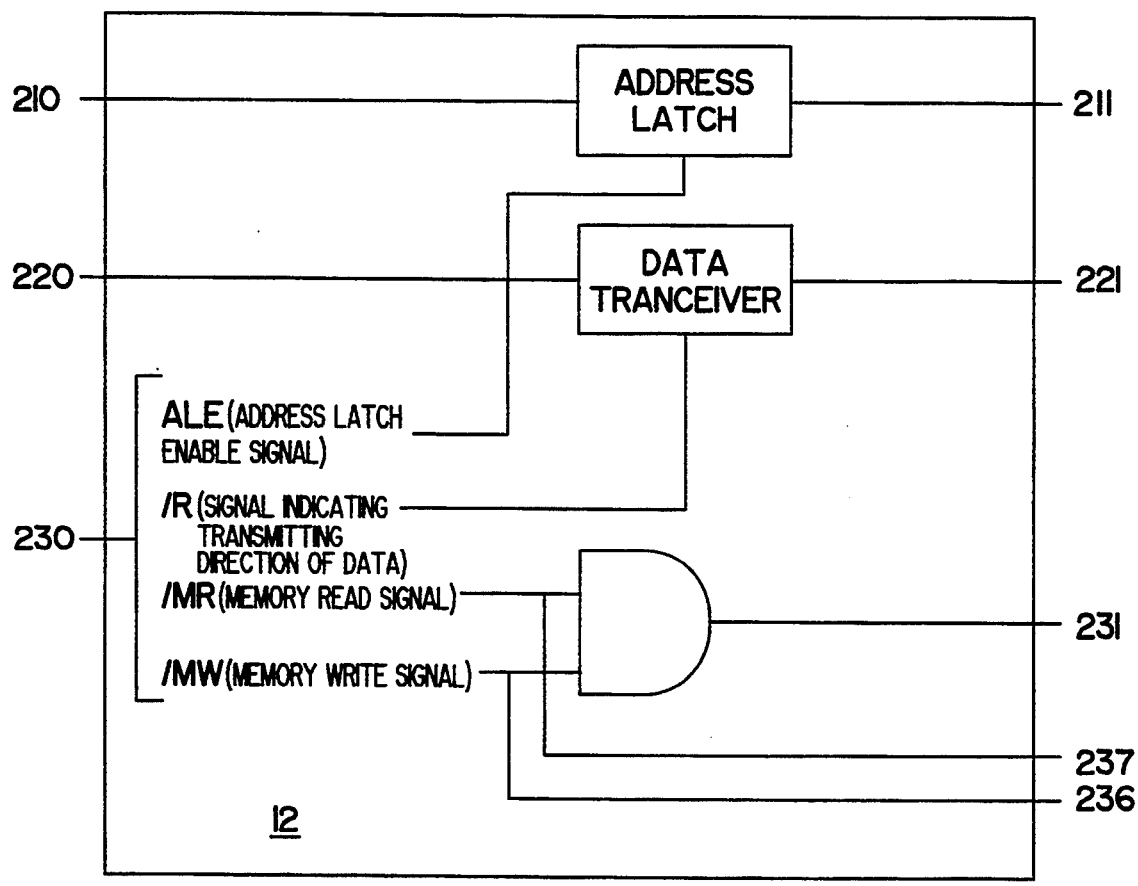
FIG. 5 shows a logic structure for a memory controller in the DOS system of FIG. 4.

FIG. 5 schematically shows the structure of the memory controller 12. The /CE signals 231 are generated from a memory read signal /MR and a memory write signal /MW of the control signals 230. Moreover, the /WE signal 236 is generated from the memory write signal /MW, and the /OE signal 237 is generated from the memory read signal /MR. The address signals 211 are generated from the address latch enable signals ALE of the control signals 230 and the address signals 210 are supplied from the CPU 11. The data signals 221 are transmitted from the CPU 11 to the memory device 13 or vice versa, via the memory controller 12 in accordance with a signal /R indicating the transmitting direction of the data.

Figure 8:
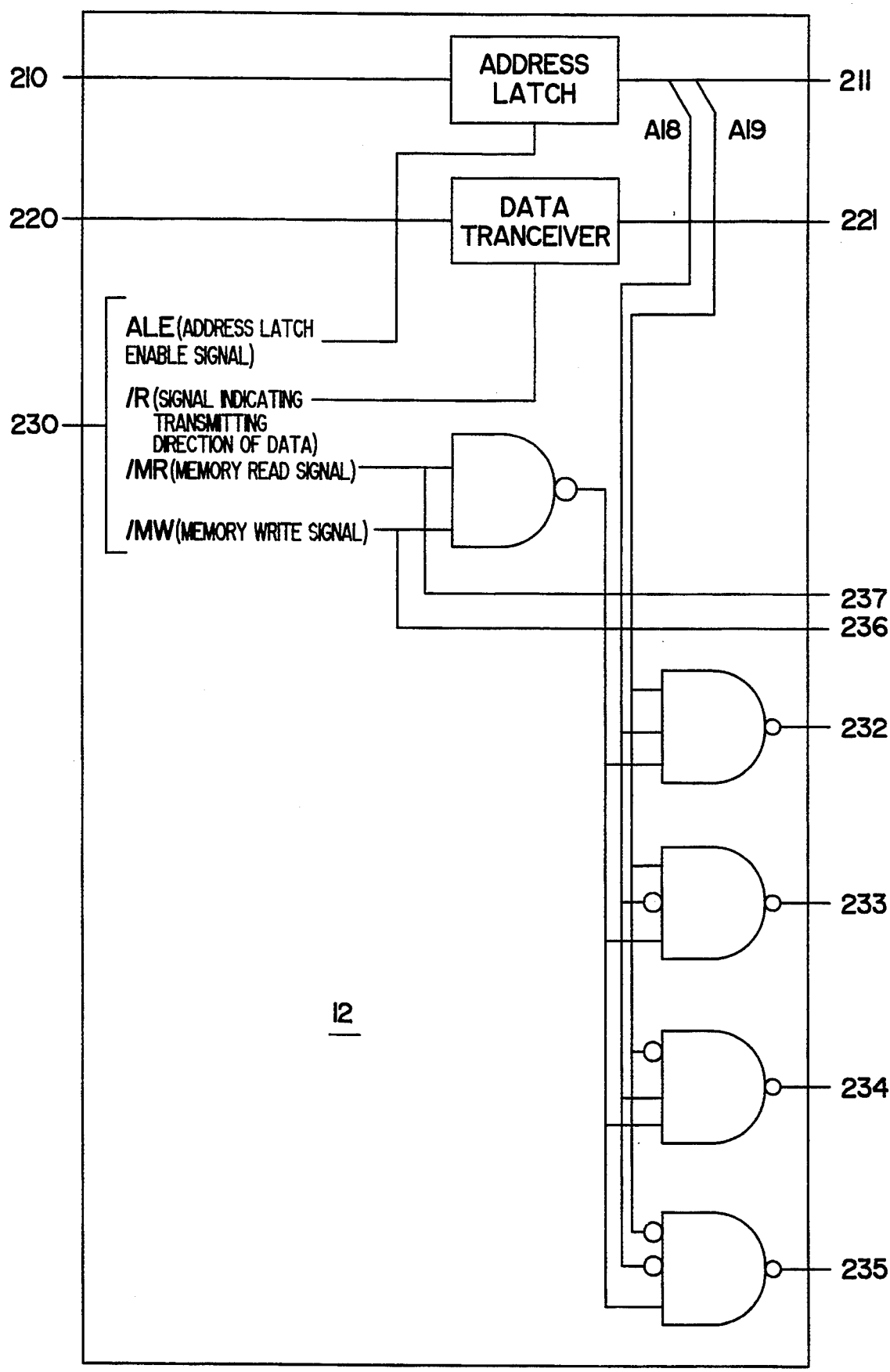
FIG. 8 shows a logic structure of a memory controller of the conventional system memory.
Figure 9:
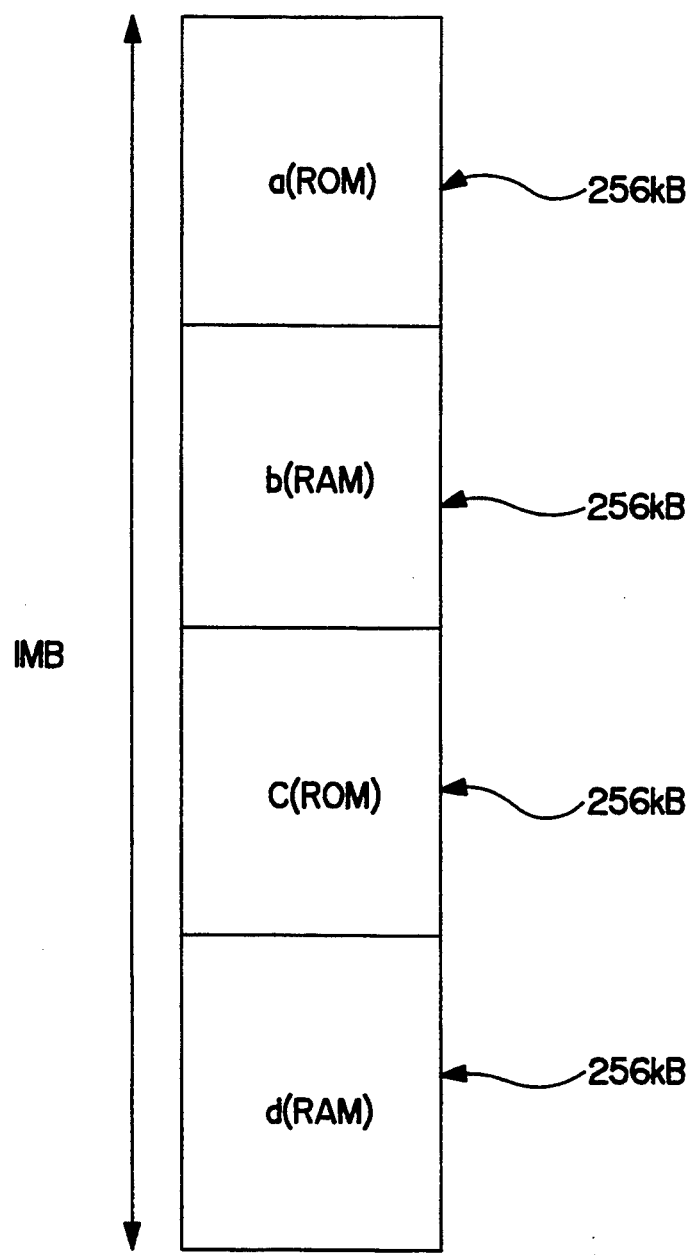
FIG. 9 schematically shows a memory space of the conventional system memory.

As is described above, the memory controller 12 of the present example does not require an address decode circuit, thereby realizing a simpler structure than that of the conventional memory controller 12 shown in FIG. 8.

Figure 6:
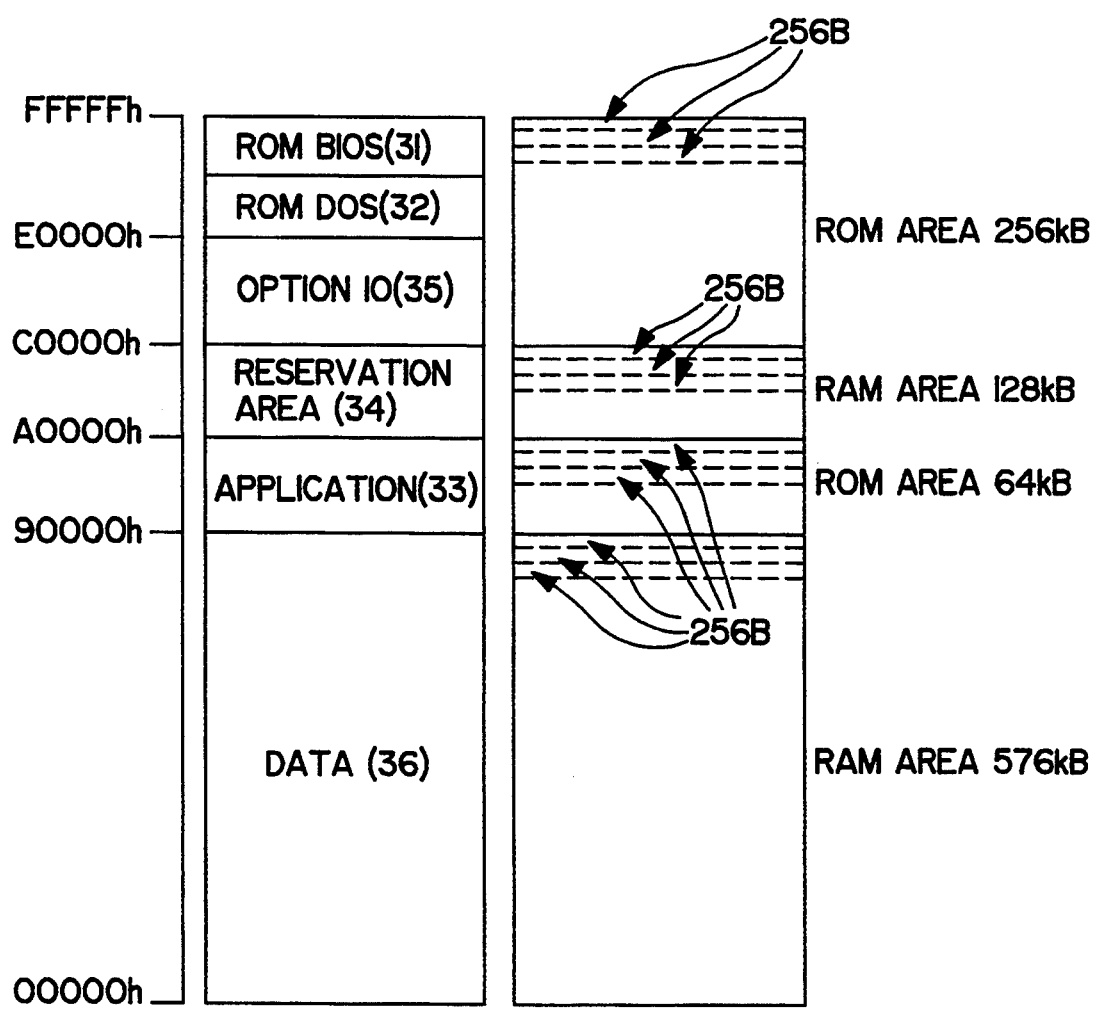
FIG. 6 shows an exemplary memory arrangement according to the DOS system of FIG. 4.
Figure 7:
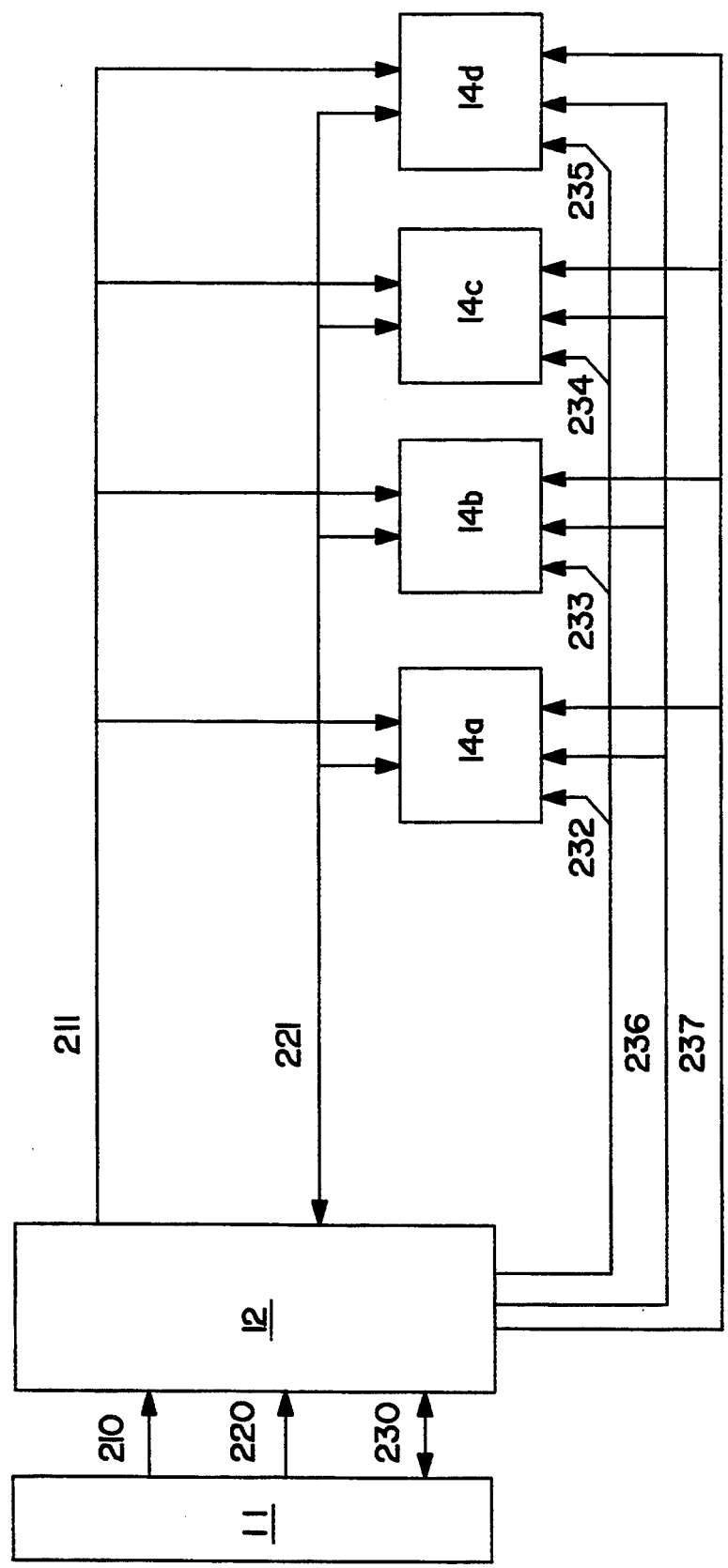
FIG. 7 shows an exemplary structure of a conventional system memory comprising ROMs and RAMs.

FIG. 6 shows an exemplary memory arrangement of the DOS system for the personal computer according to the present example.

In a memory space of the present system memory, an area from an address 00000h to an address 9FFFFh is an application program/data area having a capacity of 640 kB. An area from an address A0000h to an address BFFFFh is a reservation area 34 having a capacity of 128 kB. An area from an address C0000h to an address DFFFFh is an option I/O area 35 having a capacity of 128 kB. A device driver program of the I/O is arbitrarily stored in the arbitrary I/O area. An area from an address E0000h to an address EFFFFh is a ROM-DOS area 32 having a capacity of 64 kB. A DOS program is stored in the ROM-DOS area 32. An area from an address F0000h to an address FFFFFh is a ROM-basic input output system (BIOS) area 31 having a capacity of 64 kB. A program for controlling an input and output of the computer is stored in the ROM-BIOS area 31.

The application program/data area is divided into two areas: an application program area 33 having a capacity of 64 kB from an address 90000h to the address 9FFFFh, and a data area 36 having a capacity of 576 kB from the address 00000h to an address 8FFFFh. In the application program/data area, each capacity of the application program area and the data area is not fixed, but varied depending on the application program.

The data area 36 (576 kB) is a RAM area (576 kB), the application program area 33 is a ROM area (64 kB), and the reservation area 34 is a RAM area (128 kB). The arbitrary I/O area 35, the ROM-DOS area 32, and the ROM-BIOS area 31 constitute a ROM area (256kB in total).

As a result, the DOS program and the application program, etc. can concisely be stored as ROMs in the system. Such a system does not require external memory devices (e.g. a floppy disc), thereby obtaining a compact system with low electricity consumption.

Furthermore, according to the present example, it is possible to efficiently arrange memory devices in a memory space having a predetermined capacity.

In the system memory according to the present example, ROMs and RAMs having a minimum unit capacity can freely be arranged. Therefore, the DOS program and the application program, etc. can be stored in the system memory efficiently with a high degree of freedom for the allocation.

The present invention is not limited only to a computer system such as a personal computer, but it can be also applied to a digital information processor, etc. Moreover, the CPU to be used in the present system is not limited to the above, but any other CPU can be employed.

Figure 11:
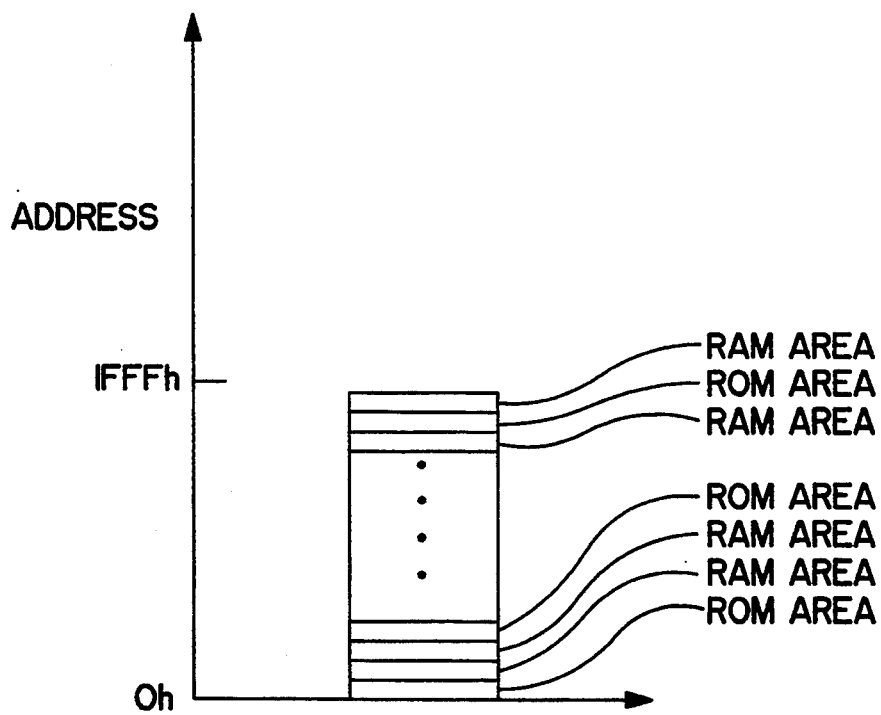
FIG. 11 shows an exemplary memory space of a microcomputer comprising the system memory of the present invention.

Next, a microcomputer comprising a system memory of Example 1 as shown in FIG. 2 or a system memory of Example 2 as shown in FIG. 3 will be described below. FIG. 11 schematically shows an exemplary memory space of such a microcomputer. In the memory space having a capacity of 8 kB, ROM areas and RAM areas each having a capacity of 256 B (minimum unit) can arbitrarily be arranged. The arrangement of the ROM areas and RAM areas is not limited to that shown in FIG. 11, but any other arrangement can be employed. The capacity of the system memory used in the microcomputer is 8 kB in total, and each capacity of the ROM and RAM areas is 256 B.

Figure 18A:
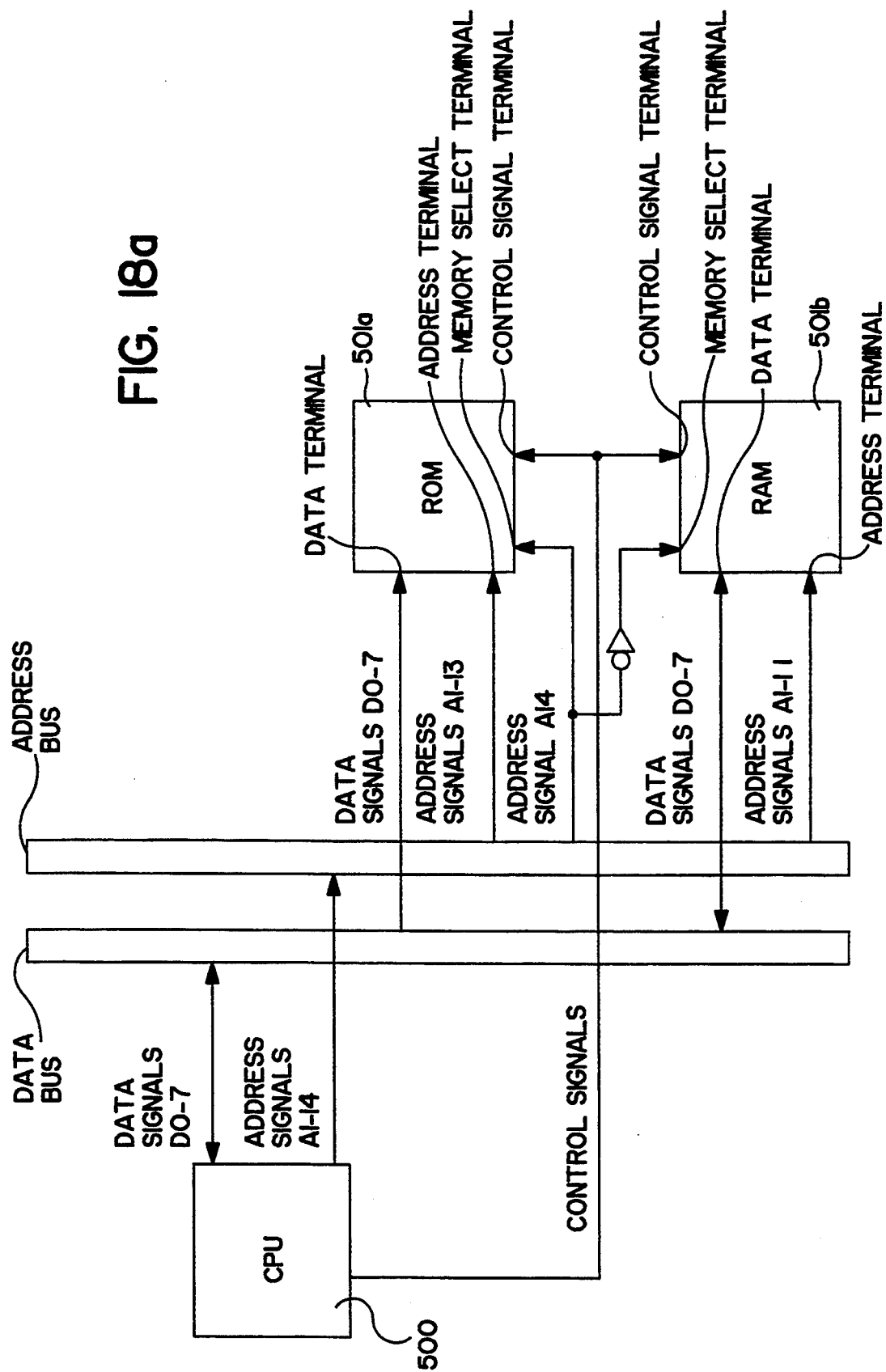
FIG. 18a shows an exemplary structure of a conventional microcomputer.
Figure 19:
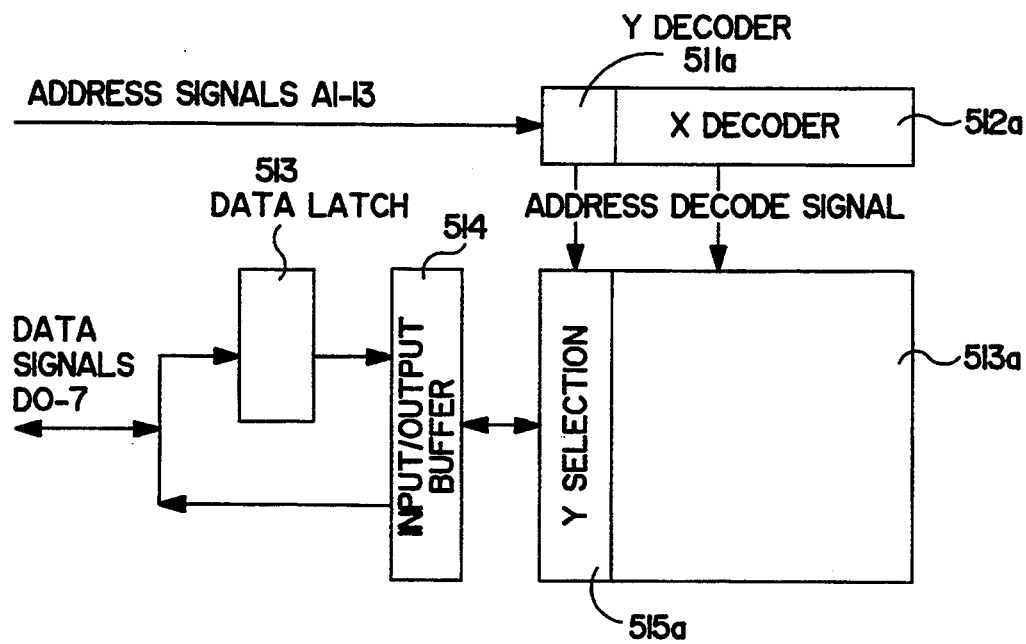
FIG. 19 shows an exemplary structure of a ROM included in the conventional microcomputer.

For comparison, a conventional microcomputer will be described referring to FIGS. 18a, 19, and 20 below. As shown in FIG. 18a, the conventional microcomputer comprises a CPU 500, a ROM 501a having a capacity of 8 kB, and a RAM 501b having a capacity of 2 kB. The ROM 501a and the RAM 501b are physically separated from each other on the same chip. FIG. 19 exemplarily shows a structure for the ROM 501a, and FIG. 20 exemplarily shows a structure of the RAM 501b.

Between the CPU 500 and the ROM 501a or the RAM 501b, address signals (A1 to A14), data signals (D0 to D7), and control signals are transmitted in the directions of the arrows as shown in FIG. 18a. In the ROM 501a, the address signals, address decode signals, data signals are transmitted in the directions of the arrows as shown in FIG. 19 In the RAM 501b, the address signals, address decode signals, data signals are transmitted in arrow directions shown in FIG. 20. An address signal A14 is input into the ROM 501a at a memory select terminal thereof. In response to the address signal A14, the access to the ROM 501a or to the RAM 501b is selected.

As shown in FIG. 19, in the ROM 501a, address signals (A1 to A13) are transmitted to a Y decoder 511a and an X decoder 512a. On the other hand, data signals (D0 to D7) are transmitted to an input/output (I/O) buffer 514 via a data latch 513. The data is read from or written into a memory cell area 513a in accordance with the address signal.

Figure 20:
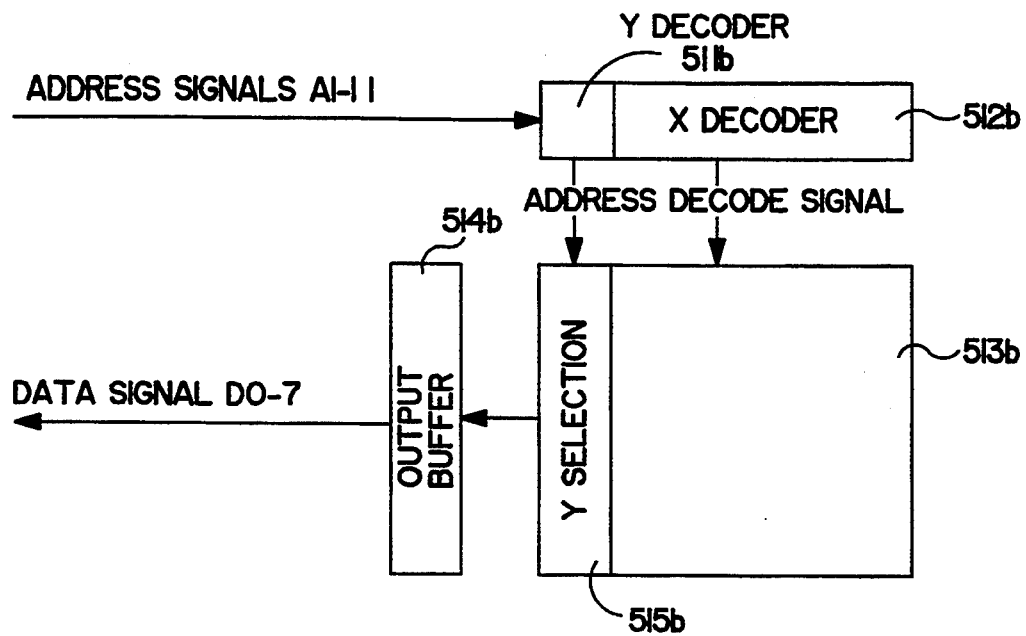
FIG. 20 shows an exemplary structure of a RAM included in the conventional microcomputer.

As shown in FIG. 20, in the RAM 501b, address signals (A1 to A11) are transmitted to a Y decoder 511b and an X decoder 512b. The data is read from a memory cell area 513b in accordance with the address signals (A1 to A11).

In such a conventional microcomputer, the ROM 501a and the RAM 501b are physically separated from each other on the same chip. Therefore, each capacity of the ROM 501a and the RAM 501b cannot be altered in accordance with the user's needs.

Figure 21:
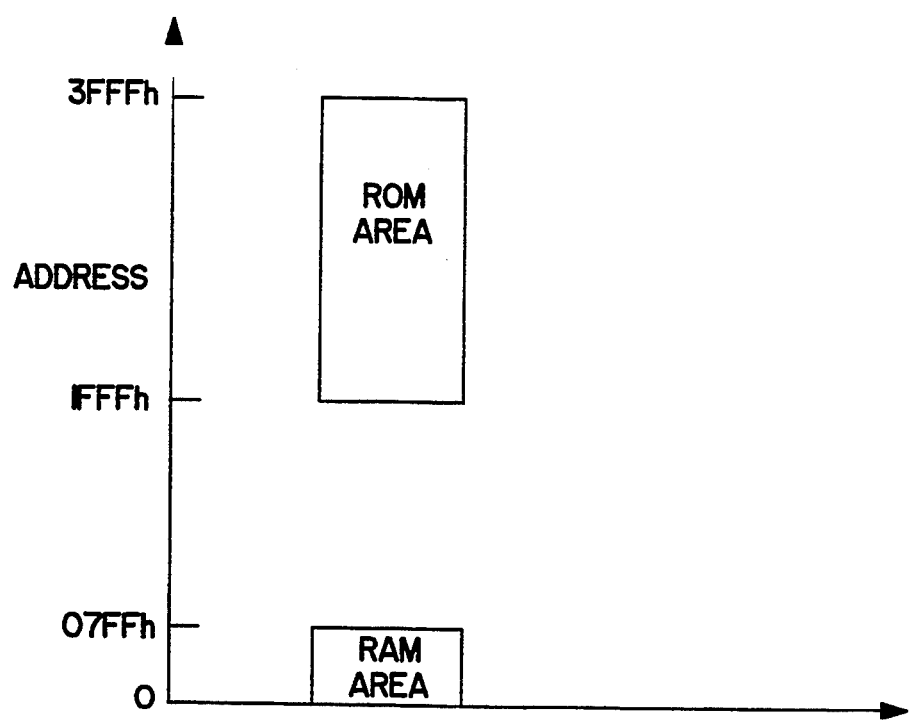

FIG. 21 schematically shows a memory space for the conventional microcomputer. The memory space having a capacity of 16 kB comprises a ROM area and a RAM area. The ROM 501a is allocated to an area having a capacity of 8 kB from the most significant address 3FFFh to an address 1FFFh. The RAM 501b is allocated to an area having a capacity of 1 kB from the least significant address 0h to an address 07FFh. According to such a conventional microcomputer, the ROM area is selected if the address signal A14 is "1", or the RAM area is selected if the address signal A14 is "0".

Figure 18B:
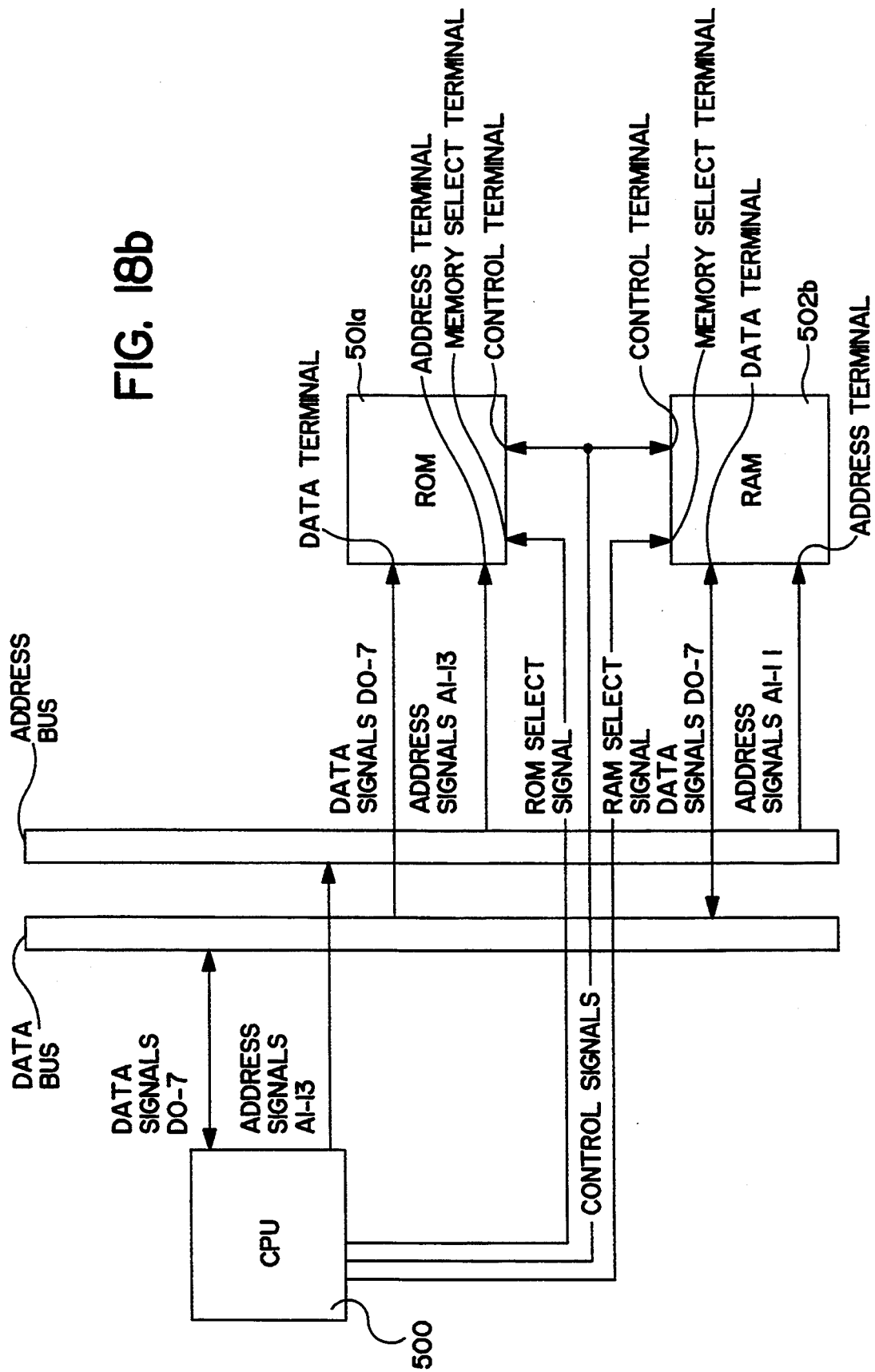
FIG. 18b shows an exemplary structure of another conventional microcomputer.

In the conventional microcomputer, the address signal A14 is used for designating the ROM area or the RAM area as shown in FIG. 18a. However, a ROM select signal and a RAM select signal supplied from the CPU 500 may be substituted for the address signal A14. FIG. 18b shows a structure for such a conventional microcomputer in which the ROM select signal and the RAM select signal are used. In FIG. 18b, components having the same functions as those shown in FIG. 18a are denoted by the same reference numerals.

Figure 22:
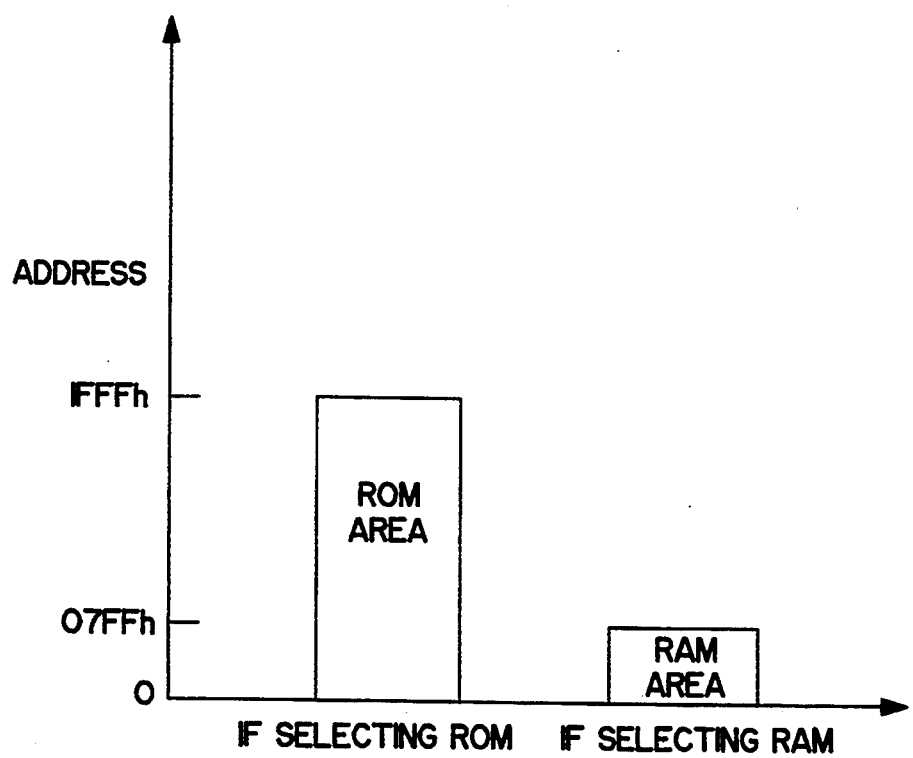
FIG. 22 schematically shows a memory space of the microcomputer of FIG. 18b.

FIG. 22 schematically shows a memory space of the microcomputer shown in FIG. 18b. The memory space has a capacity of 8 kB. The ROM 501a and the RAM 501b are allocated so as to be partially overlapped with each other in the memory space. However, the ROM select signal and the RAM select signal are controlled so as not to select the ROM 501a and the RAM 501b simultaneously. Therefore, the ROM 501a and the RAM 501b are substantially separated from each other in the memory space.

According to such a conventional microcomputer, each capacity for the ROM 501a and the RAM 501b should be determined at a step of designing the microcomputer. Therefore, the ROM area and the RAM area cannot arbitrarily be allocated in the memory space by the user. As a result, the degree of freedom for designing the program is significantly narrowed.

For description in more detail, it is assumed that the user has two options of a first microcomputer having a ROM capacity of 8 kB and a RAM capacity of 1 kB, and a second microcomputer having a ROM capacity of 16 kB and a RAM capacity of 2 kB; and that the desired program requires a ROM Capacity of 6 kB for a program area and a RAM capacity of 2 kB for a data area. In this case, both the first microcomputer and the second microcomputer have a required capacity of 8 kB if combining the ROM and RAM capacities. However, the RAM capacity of the first microcomputer is smaller by 1 kB than the desired data area. On the other hand, the ROM capacity of the second microcomputer is too large for the desired program area.

Thus, according to such a conventional microcomputer, it is impossible to design the optimum program since the ratio of the ROM capacity and the RAM capacity cannot be altered in accordance with the user's needs.

On the other hand, the present invention can provide a microcomputer having an optimum ROM capacity and an optimum RAM capacity in accordance with the user's needs by using uniformly designed chips. That is, in the microcomputer according to the present invention, the ratio of the capacities of ROMs and RAMs can be arbitrarily selected on the basis of the predetermined total capacity of the ROMs and RAMs by using the uniformly designed chips.

Figure 12A:
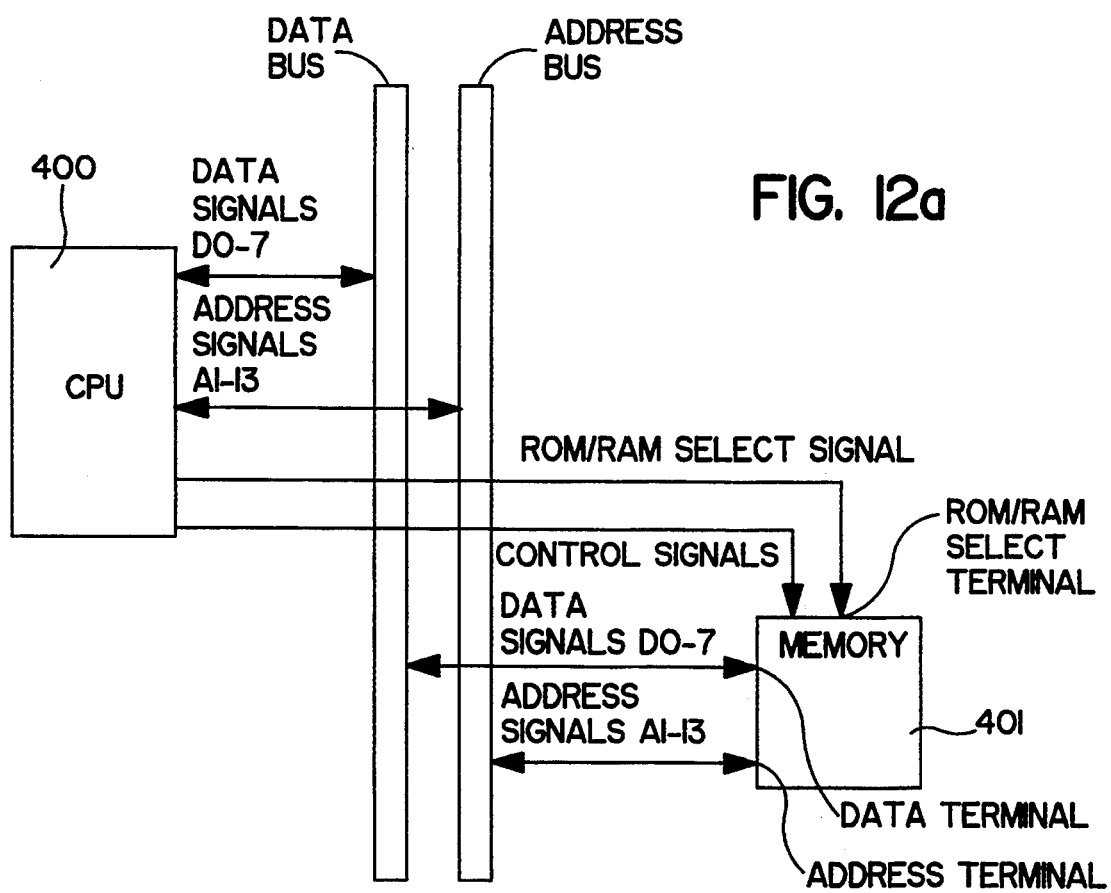
FIG. 12a shows an exemplary structure of the microcomputer according to the present invention.

Hereinafter, the microcomputer comprising the system memory according to the present invention will be described in more detail. FIG. 12a shows an exemplary structure of the microcomputer of this example. The microcomputer comprises a CPU 400 and a memory 401. Between the CPU 400 and the memory 401, address signals (A1 to A13), data signals (D0 to D7), and control signals are transmitted in the directions of the arrows as shown in FIG. 12a. The address signals and data signals are transmitted via an address bus and a data bus, respectively. A ROM/RAM select signal supplied from the CPU 400 is used for designating a ROM area or a RAM area.

Figure 13:
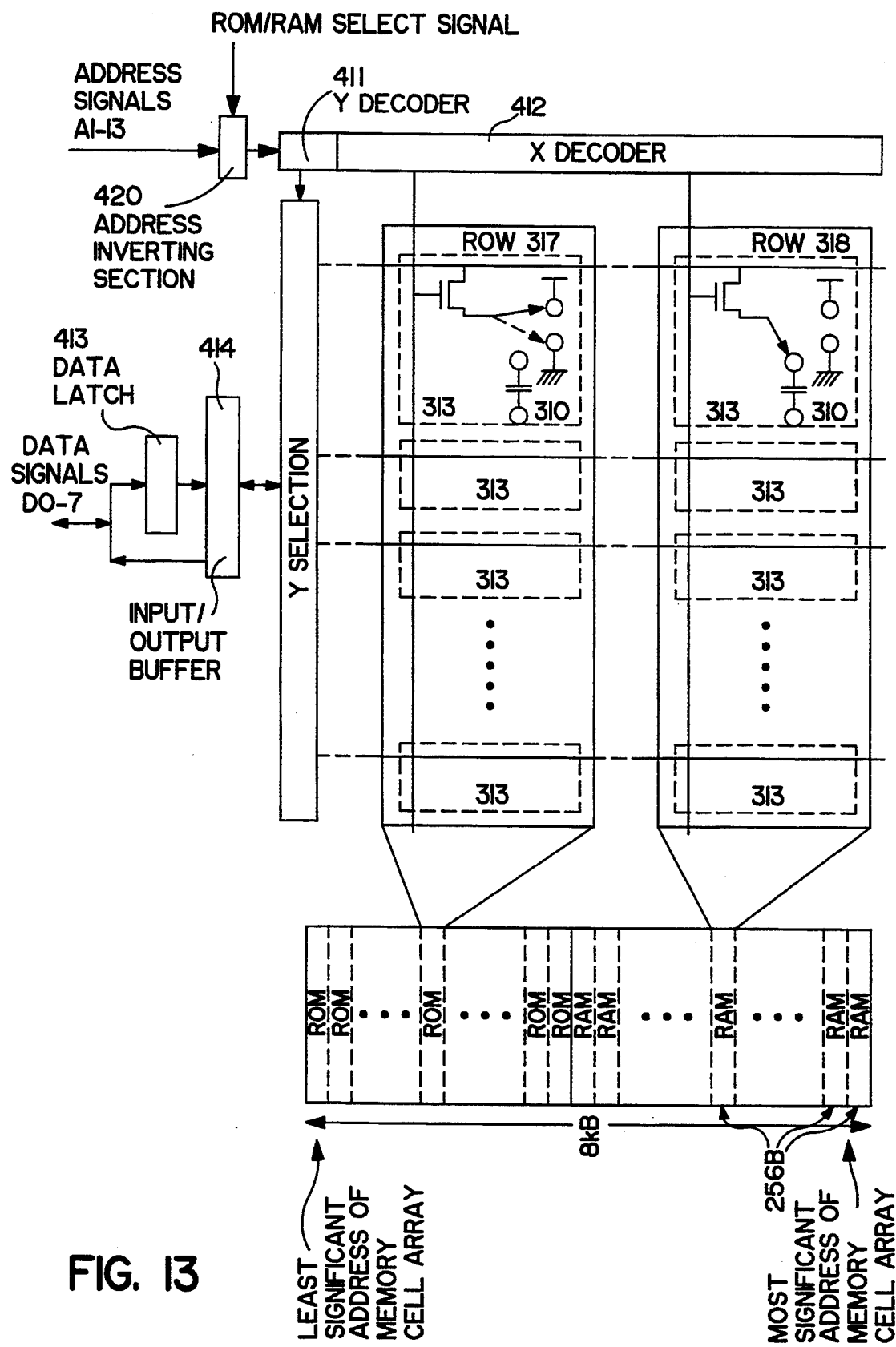
FIG. 13 shows an exemplary structure of a memory to be used in the microcomputer according to the present invention.

FIG. 13 exemplarily shows the memory 401 comprising both ROMs and RAMs on a single semiconductor chip. The memory 401 comprises a plurality of memory cells 313 arranged in a matrix. Each of the memory cells 313 comprises a MOS transistor and a capacitor, and selectively functions as a ROM element or RAM element. For example, in the case where a terminal of the MOS transistor is connected to the capacitor, the memory cell 313 functions as the RAM. When the capacitor is connected to a power supply potential or a grounded potential, data "1" or "0" can be written and read. On the other hand, in the case where the terminal of the MOS transistor is connected to the power supply potential or the grounded potential, the memory cell 313 functions as the ROM. For example, when the terminal of the MOS transistor is connected to the grounded potential, the data "0" is programmed, and when the terminal of the MOS transistor is connected to the power supply potential, the data "1" is programmed. It is previously programmed whether the terminal of the MOS transistor is connected to the grounded potential or the power supply potential by using semiconductor fabrication techniques.

Hereinafter, a structure for a memory cell array of the memory cells 313 will be described. Every memory cell 313 in the memory cell row 317 is set so as to function as the ROM. On the other hand, every memory cell 313 in the memory cell row 318 is set so as to function as the RAM. This memory cell array comprises 32 memory cell rows. Each of the 32 memory cell rows comprises 2048 memory cells 313, thereby having a memory capacity of 2048 bits, i.e., 256 B. The memory 401 has a memory capacity of 8 kB in total. The memory cell row 317 composed of ROMs is successively allocated from the least significant address of the memory cell array, and the memory cell row 318 composed of RAMs is successively allocated from the most significant address of the memory cell array. The boundary address between the memory cell rows 317 and 318 can arbitrarily be selected. Each of the memory cell rows 317 and 318 has a capacity of 256 B. Therefore, the capacity of the ROMs and RAMs can be set at a multiple of 256 B. Furthermore, the minimum unit is not limited to 256 B, but any other minimum unit can be employed by changing the number of the memory cells included in each memory cell row.

As shown in FIG. 13, the memory 401 comprises an address inverting section 420 for receiving the address signals (A1 to A13) and the ROM/RAM select signal, a Y decoder 411 and an X decoder 412 for receiving an output of the address inverting section 420, a data latch 413 for receiving the data (D0 to D7), and an I/O buffer 414 for receiving the data from the data latch 413.

Figure 15:
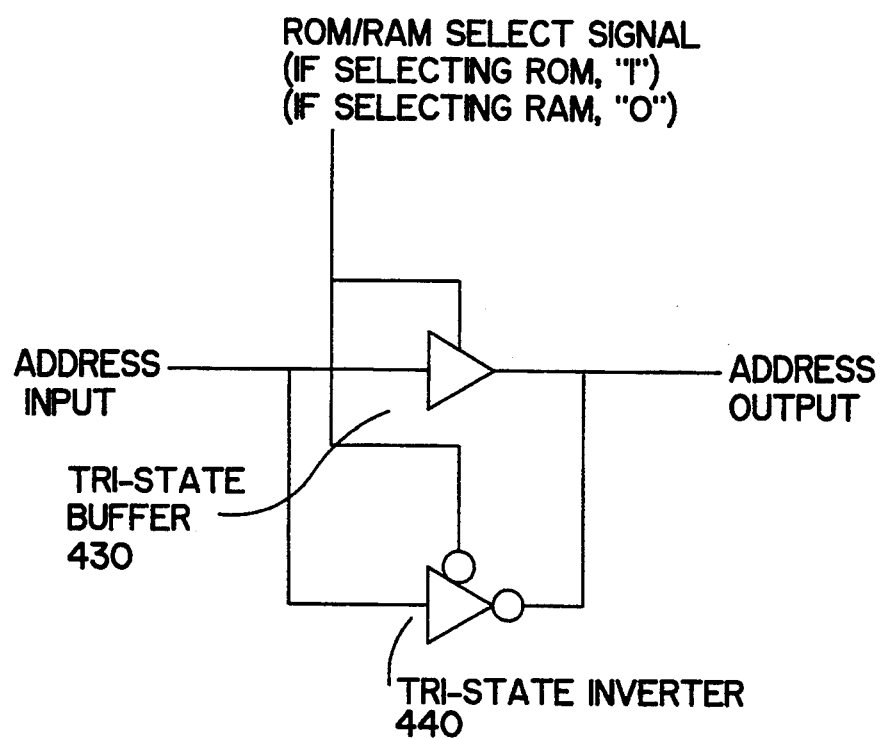
FIG. 15 shows an exemplary structure of an address inverting section to be used in the microcomputer according to the present invention.

FIG. 15 exemplarily shows a structure for the address inverting section 420. FIG. 15 only shows a circuit of the address inverting section 420 corresponding to a single bit address. Actually, there are 13 circuits corresponding to 13 address signals (A1 to A13). The address inverting section 420 comprises a tri-state buffer 430and a tri-state inverter 440. In the case where the ROM/RAM select signal is "1", the address inverting section 420 outputs an address having the same value of the inputted address. On the other hand, in the case where the ROM/RAM select signal is "0", the address inverting section 420 outputs an address having the inverted value of the inputted address. That is, in the case where the ROM/RAM select signal is "1", the address outputted from the CPU 400 is directly transmitted to the address decoder. On the other hand, in the case where the ROM/RAM select signal is "0", the address outputted from the CPU 400 is inverted and then transmitted to the address decoder.

Figure 16:
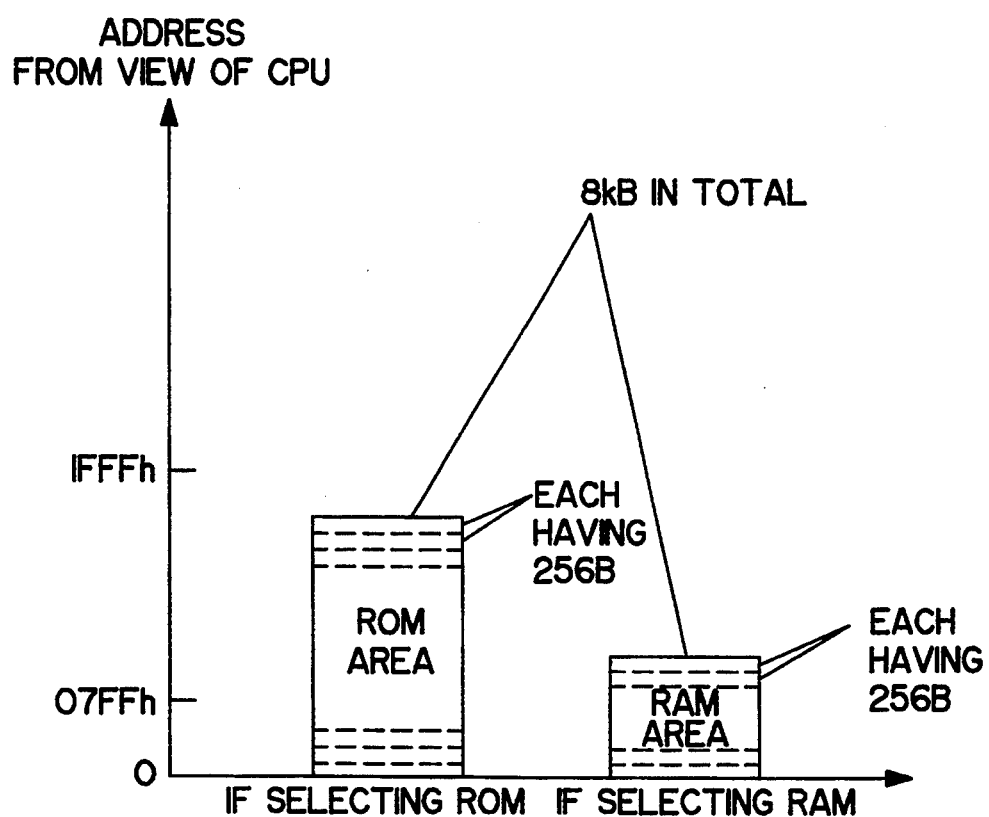
FIG. 16 schematically shows a memory space of the memory of FIG. 13.

FIG. 16 schematically shows a memory space for a microcomputer according to the present example. In the case where the ROMs are selected, the ROMs are allocated upward from the least significant address since an address space from the view of the CPU 400 has the same address as an address space of the memory cell array has. In the case where the RAMs are selected, the RAMs are allocated upward from the least significant address since the address of the memory cell array is reversed.

Figure 12B:
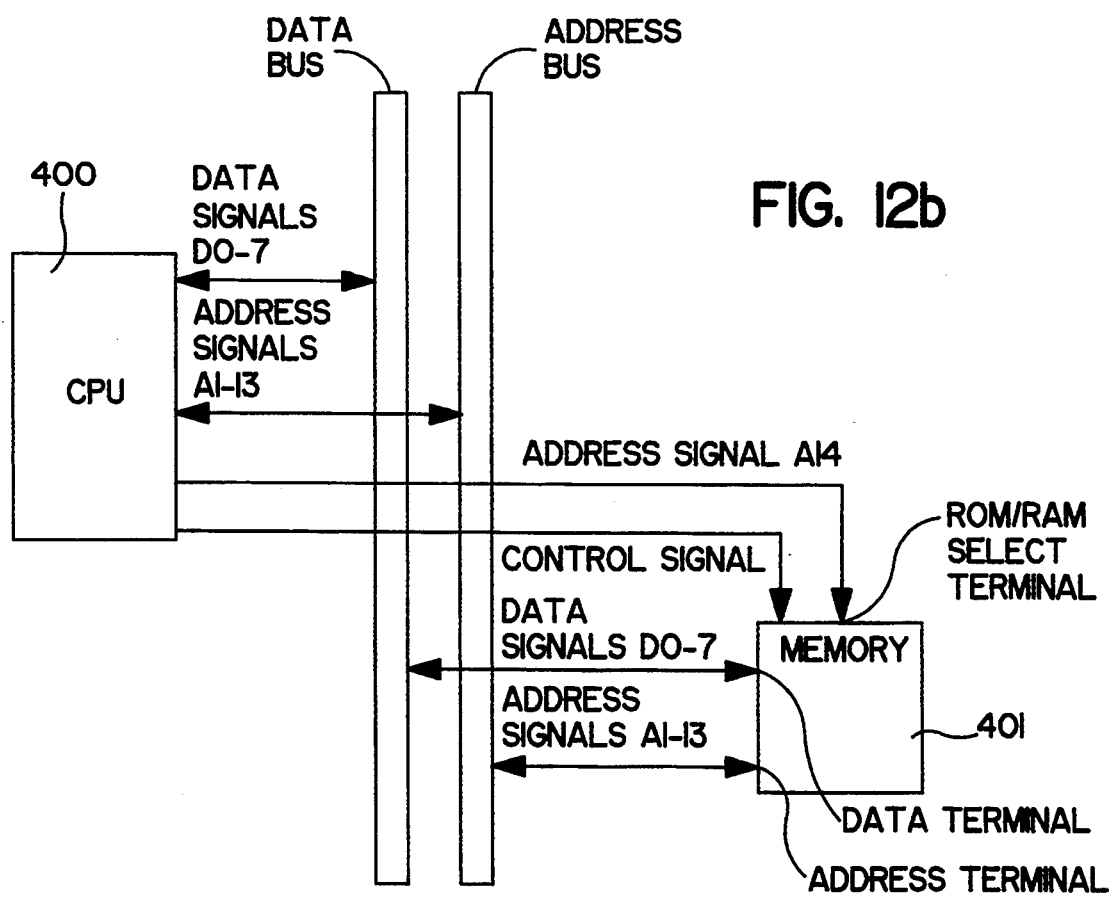
FIG. 12b shows an exemplary structure of another microcomputer according to the present invention.
Figure 17:
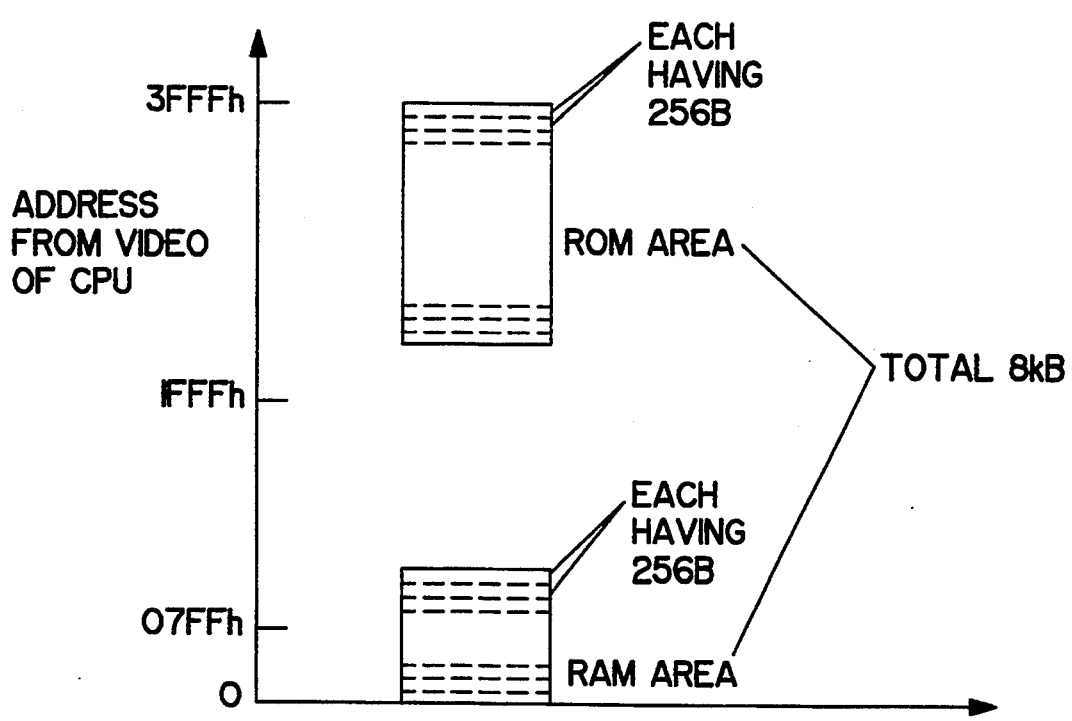
FIG. 17 schematically shows a memory space of the memory of FIG. 14.

FIG. 12b shows a structure for another microcomputer according to the present example. In the microcomputer, address signal A14 is used for designating a ROM area or a RAM area. The structure of the memory 401 shown in FIG. 12b is the same as that shown in FIG. 13 except that the address inverting section 420 is not used. FIG. 17 exemplarily shows a memory space of the microcomputer shown in FIG. 12b. The memory space has a capacity of 16 kB. In the case where ROMs are selected, an address space from the view of a CPU 400 has the same address as an address space of a memory cell array has. Therefore, the RAMs are allocated upward from the least significant address 0h, and ROMs are allocated downward from the most significant address 3FFFh.

Figure 14:
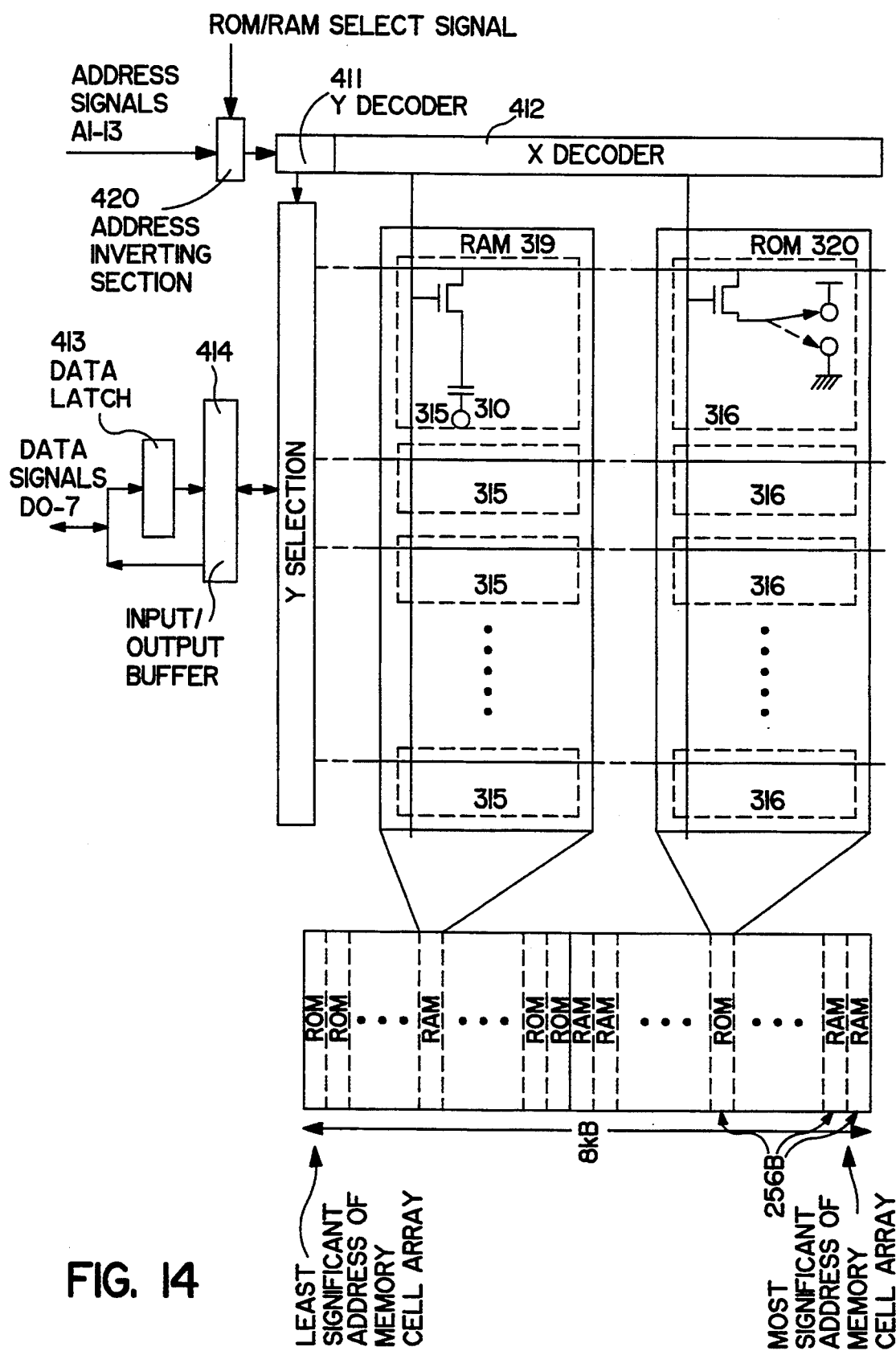
FIG. 14 shows an exemplary structure of another memory to be used in the microcomputer according to the present invention.

FIG. 14 shows an exemplary structure for another memory 401 to be used in the above-mentioned microcomputers. The memory 401 comprises a plurality of memory cells 315 and 316 arranged in a matrix. Each of the memory cells 315 and 316 includes a ROM element or a RAM element. Every memory cell 315 in a memory cell row 319 is a RAM cell. On the other hand, every memory cell 316 in a memory cell row 320 is a ROM cell. In the case where a capacitor of th RAM cell 315 is connected to a power supply potential or a grounded potential, data "1" and "0" can be written and read. On the other hand, in the case where the terminal of a MOS transistor of the ROM cell 316 is connected to the grounded potential, the data "0" is programmed; and in the case where the terminal of the MOS transistor is connected to the power supply potential, the data "1" is programmed. It is previously programmed whether the terminal of the MOS transistor is connected to the grounded potential or the power supply potential by using semiconductor fabrication techniques.

Hereinafter, the structure of a memory cell array of the memory cells will be described. This memory cell array comprises 32 memory cell rows. Each of the 32 memory cell rows comprises 2048 memory cells, thereby having a memory capacity of 2048 bits, i.e., 256 B. The memory 401 has a memory capacity of 8 kB in total. The memory cell row 319 is successively allocated from the least significant address of the memory cell array, and the memory cell row 320 is successively allocated from the most significant address of the memory cell array. The boundary address between the memory cell rows 319 and 320 can arbitrarily be selected. Each of the memory cell rows 319 and 320 has a capacity of 256 B (minimum unit). Therefore, the capacity of the ROMs and RAMs can be set at a multiple of 256 B. Furthermore, the minimum unit is not limited to 256 B, but any other minimum unit can be employed by changing the number of the memory cells included in each memory cell row.

As is described above, a microcomputer comprising the system memory of the present invention can be produced so as to have a structure desired by the user. That is, a high degree of freedom for the allocation can be attained according to the present invention.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A system memory in which a memory space comprises a plurality of read only areas and a plurality of write and read areas, wherein
   the respective read only areas comprise at least one first region, the first region comprising a first word line and as a minimum unit of the first region a plurality of read only memory cells connected to the first word line,
   the respective write and read areas comprise at least one second region, the second region comprising a second word line and as a minimum unit of the second region a plurality of random access memory cells connected to the second word line,
   the read only areas and the write and read areas are mixedly and contiguously arranged in the memory space in an arbitrary arrangement, and
   the total number of the plurality of read only memory cells connected to the first word line as the minimum unit of the first region is the same as the total number of the plurality of random access memory cells connected to the second word line as the minimum unit of the second region.

2. A system memory according to claim 1, comprising a plurality of memory cells having both a ROM function and a RAM function,
   wherein in the first region, the memory cells are set to function as the read only memory cells, and
   in the second region, the memory cells are set to function as the random access memory cells.

3. A system memory according to claim 1, comprising a plurality of ROMs and a plurality of RAMs,
   wherein the first region comprises the ROMs, and
   the second region comprises the RAMs.

4. A system memory according to claim 1, wherein at least one program is stored in the read only areas, the program is selected from a group consisting of a system program, an application program and a program for controlling an input and output, and
   data or a program is stored in the write and read areas.

5. A system memory according to claim 1, wherein a ratio of a memory capacity of the read only areas to a memory capacity of the write and read area can arbitrarily be set in accordance with the request of a user.

6. A microcomputer comprising the system memory of the type according to claim 1,
   wherein at least one program for controlling the microcomputer is stored in the read only areas, and
   data is stored in the write and read areas when said at least one program is carried out.

7. A microcomputer according to claim 6, comprising:
   a decoder for decoding address signals so as to select a designated address in the memory space,
   a ROM/RAM select signal for selecting the access to the read only areas or the write and read areas, and
   an address inverting section for allowing or disallowing inversion of the address signals to be inputted into the decoder in accordance with the ROM/RAM select signal.

8. A microcomputer according to claim 6, comprising:
   a decoder for decoding address signals so as to select a designated address in the memory space, a ROM/RAM select signal for selecting the access to the read only areas or the write and read areas, the ROM/RAM select signal being the most significant of address signals inputted into the decoder.

9. A system memory according to claim 1, wherein the system memory is fabricated on a single semiconductor chip.

10. A system memory according to claim 1, wherein one word line is selected in response to an address applied to the system memory so that a signal charge is stored into or read out from the memory space.

11. A digital information processor comprising the system memory of the type according to claim 1,
wherein at least one program for controlling the digital information processor is stored in the read only areas, and
data is stored in the write and read areas when said at least one program is carried out.

12. A digital information processor according to claim 11, comprising:
a decoder for decoding address signals so as to select a designated address in the memory space,
a ROM/RAM select signal for selecting the access to the read only areas or the write and read areas, and
an address inverting section for allowing or disallowing inversion of the address signals to be inputted into the decoder in accordance with the ROM/RAM select signal.

13. A digital information processor according to claim 11, comprising:
a decoder for decoding address signals so as to select a designated address in the memory space,
a ROM/RAM select signal for selecting the access to the read only areas or the write and read areas, the ROM/RAM select signal being the most significant of address signals inputted into the decoder.

* * * * *

UNITED STATES PATENT AND TRADEMARK OFFICE
CERTIFICATE OF CORRECTION

PATENT NO. : 5,432,742

DATED : July 11, 1995

INVENTOR(S) : Makoto Ihara et al.

It is certified that error appears in the above-indentified patent and that said Letters Patent is hereby corrected as shown below:

```
Column 8, line 22:    IS: "FIG. 19 In"    SHOULD BE: --FIG. 19. In--;
column 9, line 21:    IS: "Capacity"      SHOULD BE: --capacity--;
column 12, line 46:   IS: "area"          SHOULD BE: --areas--.
```

Signed and Sealed this

Twenty-eighth Day of November 1995

Attest:

BRUCE LEHMAN

*Attesting Officer*          *Commissioner of Patents and Trademarks*